(12) United States Patent
Luo et al.

(10) Patent No.: US 11,442,833 B2
(45) Date of Patent: Sep. 13, 2022

(54) MEMORY SUB-SYSTEM TEMPERATURE CONTROL

(71) Applicant: Micron Technology, Inc., Boise, ID (US)

(72) Inventors: Ting Luo, Santa Clara, CA (US); Tao Liu, San Jose, CA (US); Christopher J. Bueb, Folsom, CA (US); Eric Yuen, Dublin, CA (US); Cheng Cheng Ang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/085,671

(22) Filed: Oct. 30, 2020

(65) Prior Publication Data

US 2022/0138073 A1   May 5, 2022

(51) Int. Cl.
*G06F 11/00* (2006.01)
*G06F 11/30* (2006.01)
(Continued)

(52) U.S. Cl.
CPC ........ *G06F 11/3058* (2013.01); *G06F 11/076* (2013.01); *G06F 11/0772* (2013.01);
(Continued)

(58) Field of Classification Search
CPC ............... G06F 11/3058; G06F 11/076; G06F 11/0772; G06F 11/3037; G06F 11/0751;
(Continued)

(56) References Cited

U.S. PATENT DOCUMENTS 8,982,653 B2 * 3/2015 Nurminen .......... G11C 13/0035
365/222
9,668,337 B2 * 5/2017 Stoev ................... G11C 16/349
(Continued)

FOREIGN PATENT DOCUMENTS

WO    2017074570 A1    5/2017

OTHER PUBLICATIONS

P. Wyns and R. L. Anderson, "Low-temperature operation of silicon dynamic random-access memories," in IEEE Transactions on Electron Devices, vol. 36, No. 8, pp. 1423-1428, Aug. 1989, doi: 10.1109/16.30954. (Year: 1989).*
(Continued)

*Primary Examiner* — Anthony J Amoroso
(74) *Attorney, Agent, or Firm* — Brooks, Cameron & Huebsch, PLLC

(57) ABSTRACT

A method includes monitoring a temperature of a memory component of a memory sub-system to determine that the temperature of the memory component corresponds to a first monitored temperature value; writing data to the memory component of the memory sub-system while the temperature of the memory component corresponds to the first monitored temperature value; determining that the first monitored temperature value exceeds a threshold temperature range; monitoring the temperature of the memory component of the memory sub-system to determine that the temperature of the memory component corresponds to a second monitored temperature value that is within the threshold temperature range; and rewriting the data to the memory component of the memory sub-system while the temperature of the memory component corresponds to the second monitored temperature value.

14 Claims, 4 Drawing Sheets

(51) Int. Cl.
    *G06F 11/07*     (2006.01)
    *G11C 7/04*     (2006.01)
    *G11C 11/406*     (2006.01)

(52) U.S. Cl.
    CPC ............ *G06F 11/3037* (2013.01); *G11C 7/04* (2013.01); *G11C 11/40626* (2013.01)

(58) Field of Classification Search
    CPC .. G06F 11/0754; G06F 11/0766; G06F 11/30; G06F 11/3034; G06F 1/20; G06F 1/203; G06F 1/206; G06F 1/3225; G11B 5/40; G11B 5/5565; G11C 7/04
    See application file for complete search history.

(56) References Cited

U.S. PATENT DOCUMENTS

| | | | | |
|---|---|---|---|---|
| 10,678,315 | B2 * | 6/2020 | Sundaram | G06F 1/3225 |
| 11,062,756 | B2 * | 7/2021 | Gopalakrishnan | G06F 3/0679 |
| 11,132,037 | B2 * | 9/2021 | Nowell | G06F 1/3275 |
| 2010/0208530 | A1 * | 8/2010 | Chua | G11C 16/0441 365/189.011 |
| 2014/0231954 | A1 | 8/2014 | Lue | |
| 2016/0179386 | A1 | 6/2016 | Zhang | |
| 2017/0262197 | A1 | 9/2017 | Tan | |
| 2017/0345510 | A1 * | 11/2017 | Achtenberg | G06F 11/1048 |
| 2018/0253345 | A1 * | 9/2018 | Kim | G06F 11/073 |
| 2018/0293009 | A1 | 10/2018 | Sharon et al. | |
| 2020/0051648 | A1 | 2/2020 | Yang | |
| 2020/0081507 | A1 * | 3/2020 | Nowell | G11C 7/04 |
| 2020/0142799 | A1 | 5/2020 | Hiruta | |
| 2020/0251162 | A1 | 8/2020 | Alsasua et al. | |

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

International Search Report and Written Opinion from related PCT Application No. PCT/US2021/055382, dated Feb. 7, 2022, 9 pages.

* cited by examiner

MEMORY SUB-SYSTEM TEMPERATURE CONTROL

TECHNICAL FIELD

Embodiments of the disclosure relate generally to memory sub-systems, and more specifically, relate to memory sub-system temperature control.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
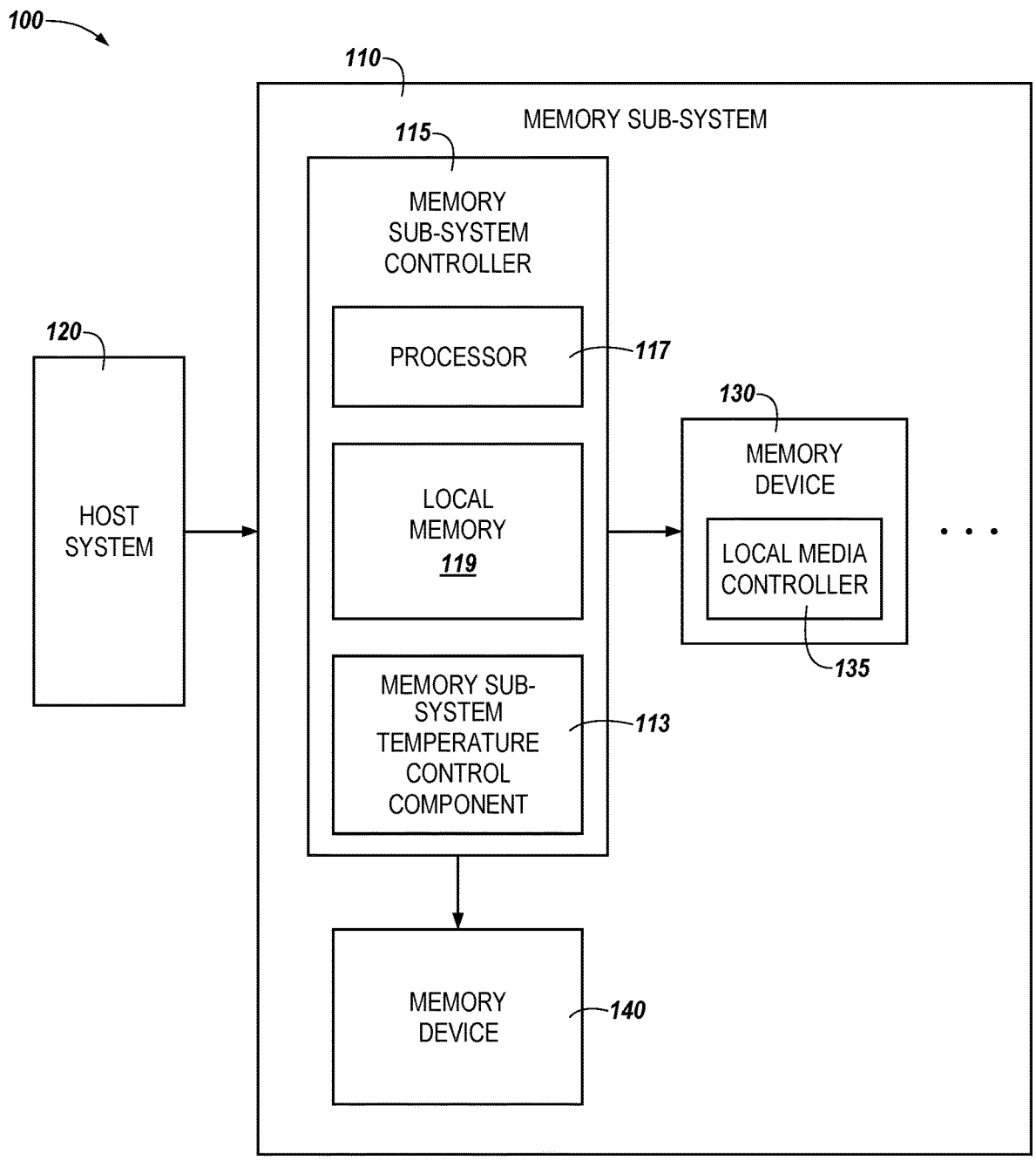
FIG. 1 illustrates an example computing system that includes a memory sub-system in accordance with some embodiments of the present disclosure.

Aspects of the present disclosure are directed to memory sub-system temperature control, in particular to memory sub-systems that include a memory sub-system temperature control component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system. A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Memory sub-systems can be utilized for many different applications. These applications include mobile device applications, e.g., mobile phones, tablets, etc., automobile applications, commercial applications. aeronautic applications, military applications, and industrial applications, among others. Different applications may different operating temperature ranges and/or may be required to perform under differing conditions. As such, memory sub-systems may be utilized over a very broad operating temperature range.

Memory sub-systems, e.g., flash devices, can operate by storing different charges on a device, e.g., floating gate. The stored charge interferes with a control gate to indicate a value stored in a cell. For example, in a single level cell, the read voltage of the control gate is calibrated to be between a charge for a '1' bit and a charge for a '0' bit; thus the read voltage is strong enough to overcome the '1' charge and not strong enough to overcome the '0' bit charge. For multi-level-cells (MLCs) of two bits or TLC of three bits, the floating gate charge can have many states (e.g., four and eight respectively) to represent two or three bits at each state. Charge accumulation and dissipation from the cells varies with temperature. Higher read errors due to different write and read temperature, e.g., a write at −40° C. and read at 108° C. and vice versa, are related to the unequal VT distribution shifts between the NAND cell voltage and the read voltages. This is known as a cross-temperature, where the charge on the cell crosses a read boundary due to the temperature. Memory sub-systems, e.g., NAND flash memory, can be temperature sensitive. For instance, in NAND flash memory, writing data at a first temperature and then reading the data at a second temperature, which is different than the first temperature, e.g., exceeding a threshold temperature range as discussed further herein, can result in an increased raw bit error rate (RBER), as compared to writing data and then reading the data at a same temperature.

Some previous approaches to address cross-temperature adverse effects have utilized temperature compensation schemes, such as built in temperature compensation schemes. Built in temperature compensation schemes have been utilized to adjust read voltages based upon an immediate temperature of the NAND. However, the voltage shifts that are experienced by the NAND flash memory may not correlate with an internal read voltage adjustment, particularly in extreme cross-temperature conditions.

Aspects of the present disclosure address the above and other deficiencies by utilizing memory sub-system temperature control. For instance, the present disclosure provides that a temperature of a memory component of a memory sub-system may be monitored when writing data to the memory component of the memory sub-system. Upon determination that the data was written at a temperature that exceeds, e.g., the temperature is above or below, a threshold temperature range the data can be assigned an indication to rewrite the data when the memory component of the memory sub-system is at a temperature within the threshold temperature range. Advantageously, rewriting the data when the memory component of the memory sub-system is at a temperature within the threshold temperature range can help provide reliability, e.g., that the rewritten data can be reliably read.

FIG. 1 illustrates an example computing system 100 that includes a memory sub-system 110 in accordance with some embodiments of the present disclosure. The memory sub-system 110 can include media, such as one or more volatile memory devices, e.g., memory device 140, one or more non-volatile memory devices, e.g., memory device 130, or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle, e.g., airplane, drone, train, automobile, or other conveyance, Internet of Things (IoT) enabled device, embedded computer, e.g., one included in a vehicle, industrial equipment, or a networked commercial device, or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection, e.g., without intervening components, whether wired or wireless, including connections such as electrical, optical, magnetic, and the like.

The host system 120 can include a processor chipset and a software stack executed by the processor chipset. The processor chipset can include one or more cores, one or more caches, a memory controller, e.g., an SSD controller, and a storage protocol controller, e.g., PCIe controller, SATA controller. The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components, e.g., memory devices 130, when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices, e.g., memory device 140, can be, but are not limited to, random access memory (RAM), such as dynamic random-access memory (DRAM) and synchronous dynamic random access memory (SDRAM).

Some examples of non-volatile memory devices, e.g., memory device 130, include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory, e.g., NAND, pages can be grouped to form blocks.

Although non-volatile memory components such as three-dimensional cross-point arrays of non-volatile memory cells and NAND type memory, e.g., 2D NAND, 3D NAND, are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAIVI), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as firmware, one or more integrated circuits, and/or discrete components, a buffer memory, or a combination thereof. The hardware can include digital circuitry with dedicated, i.e., hard-coded, logic to perform the operations described herein. The memory sub-system controller 115 can be a microcontroller, special purpose logic circuitry, e.g., a field programmable gate array (FPGA), an application specific integrated circuit (ASIC), etc., or other suitable processor.

The memory sub-system controller 115 can include a processor 117, e.g., a processing device, configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control, e.g., provided by an external host, or by a processor or controller separate from the memory sub-system.

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address, e.g., logical block address (LBA), namespace, and a physical address, e.g., physical block address, physical media locations, etc., that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer, e.g., DRAM, and address circuitry, e.g., a row decoder and a column decoder, that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller, e.g., memory sub-system controller 115, can externally manage the memory device 130, e.g., perform media management operations on the memory device 130. In some embodiments, a memory device 130 is a managed memory device, which is a raw memory device combined with a local controller, e.g., local controller 135, for media management within the same memory device package. An example of a managed memory device is a managed NAND (MNAND) device.

The memory sub-system 110 can include a memory sub-system temperature control component 113. Although not shown in FIG. 1 so as to not obfuscate the drawings, the memory sub-system temperature control component 113 can include various circuitry to facilitate monitoring temperature characteristics for a memory sub-system and/or components of the memory sub-system, determining whether to perform thermal throttling operations for the memory sub-system and/or components of the memory sub-system based on data reliability parameters of the memory sub-system and/or components of the memory sub-system, and/or controlling performance of thermal throttling operations for the memory sub-system and/or the components of the memory sub-system. In some embodiments, the memory sub-system temperature control component 113 can include special purpose circuitry in the form of an ASIC, FPGA, state machine, and/or other logic circuitry that can allow the memory sub-system temperature control component 113 to orchestrate and/or perform the operations described herein.

In some embodiments, the memory sub-system controller 115 includes at least a portion of the memory sub-system temperature control component 113. For example, the memory sub-system controller 115 can include a processor 117 (processing device) configured to execute instructions stored in local memory 119 for performing the operations described herein. In some embodiments, the memory sub-system temperature control component 113 is part of the host system 110, an application, or an operating system.

In a non-limiting example, an apparatus, e.g., the computing system 100, can include a memory sub-system temperature control component 113. The memory sub-system temperature control component 113 can be resident on the memory sub-system 110. As used herein, the term "resident on" refers to something that is physically located on a particular component. For example, the memory sub-system temperature control component 113 being "resident on" the memory sub-system 110 refers to a condition in which the hardware circuitry that comprises the memory sub-system temperature control component 113 is physically located on the memory sub-system 110. The term "resident on" may be used interchangeably with other terms such as "deployed on" or "located on," herein.

The memory sub-system temperature control component 113 can be configured to monitor a temperature of a memory component of the memory sub-system 110 to determine that the temperature of the memory component corresponds to a first monitored temperature value. Data can be written to the memory component of the memory sub-system 110 while the temperature of the memory component corresponds to the first monitored temperature value. The memory sub-system temperature control component 113 can be configured to determine that the first monitored temperature value exceeds a threshold temperature range and further monitor the temperature of the memory component of the memory sub-system 110 to determine that the temperature of the memory component corresponds to a second monitored temperature value that is within the threshold temperature range. After the determination that the second monitored temperature value is within the threshold temperature range, the data can be rewritten to the memory component of the memory sub-system 110 while the temperature of the memory component is within the threshold temperature range, e.g., corresponding to the second monitored temperature value. As described above, the memory components can be memory dice or memory packages that form at least a portion of the memory device 130.

The memory sub-system temperature control component 113 can be further configured to assign an indication to the data, e.g., mark the data, flag the data, etc. written to the memory component of the memory sub-system 110 at the first monitored temperature. Assigning the indication to the data can provide that the indicated data will be rewritten to the memory component at a later time, i.e. when the memory component is at temperature within the threshold temperature range, such as the previously mentioned second monitored temperature value. Advantageously, rewriting the data when the memory component of the memory sub-system 110 is at a temperature within the threshold temperature range can help provide reliability, e.g., that the rewritten data can be reliably read.

The memory sub-system temperature control component 113 can be further configured to assign an indication to the data, e.g., mark the data, flag the data, etc. that is rewritten to the memory component of the memory sub-system 110 at a temperature within the threshold temperature range, e.g., at the previously mentioned second monitored temperature. Rewritten data that is indicated to be rewritten to the memory component of the memory sub-system 110 at a temperature within the threshold temperature range will not be rewritten to the memory component due to exceeding the threshold temperature range.

The memory sub-system temperature control component 113 can be further configured to assign an indication to the data, e.g., mark the data, flag the data, etc. that is written to the memory component of the memory sub-system 110 at a temperature within the threshold temperature range, e.g., at the previously mentioned second monitored temperature. Data that is indicated to be written to the memory component of the memory sub-system 110 at a temperature within the threshold temperature range will not be rewritten to the memory component due to exceeding the threshold temperature range.

One or more embodiments of the present disclosure provide that data written to the memory component of the memory sub-system 110 at a particular temperature, e.g., at the previously mentioned first monitored temperature or at the previously mentioned second monitored temperature, can be read at a third monitored temperature that is different than the first monitored temperature and the second monitored temperature. One or more embodiments of the present disclosure provide that the third monitored temperature is within threshold temperature range, as discussed further herein.

The memory sub-system temperature control component 113 can be further configured to continuously monitor the temperature of the memory component of a memory sub-system 110. Alternatively, one or more embodiments provide that the memory sub-system temperature control component 113 can be further configured to incrementally, e.g., over a time interval, monitor the temperature of the memory component of a memory sub-system 110. Various time intervals may be utilized for different applications. For example, the time interval may be 0.1 seconds (s), 0.5 s, 1.0 s, 5.0 s, 10.0 s, or 60.0 s, among other time intervals.

Figure 2:
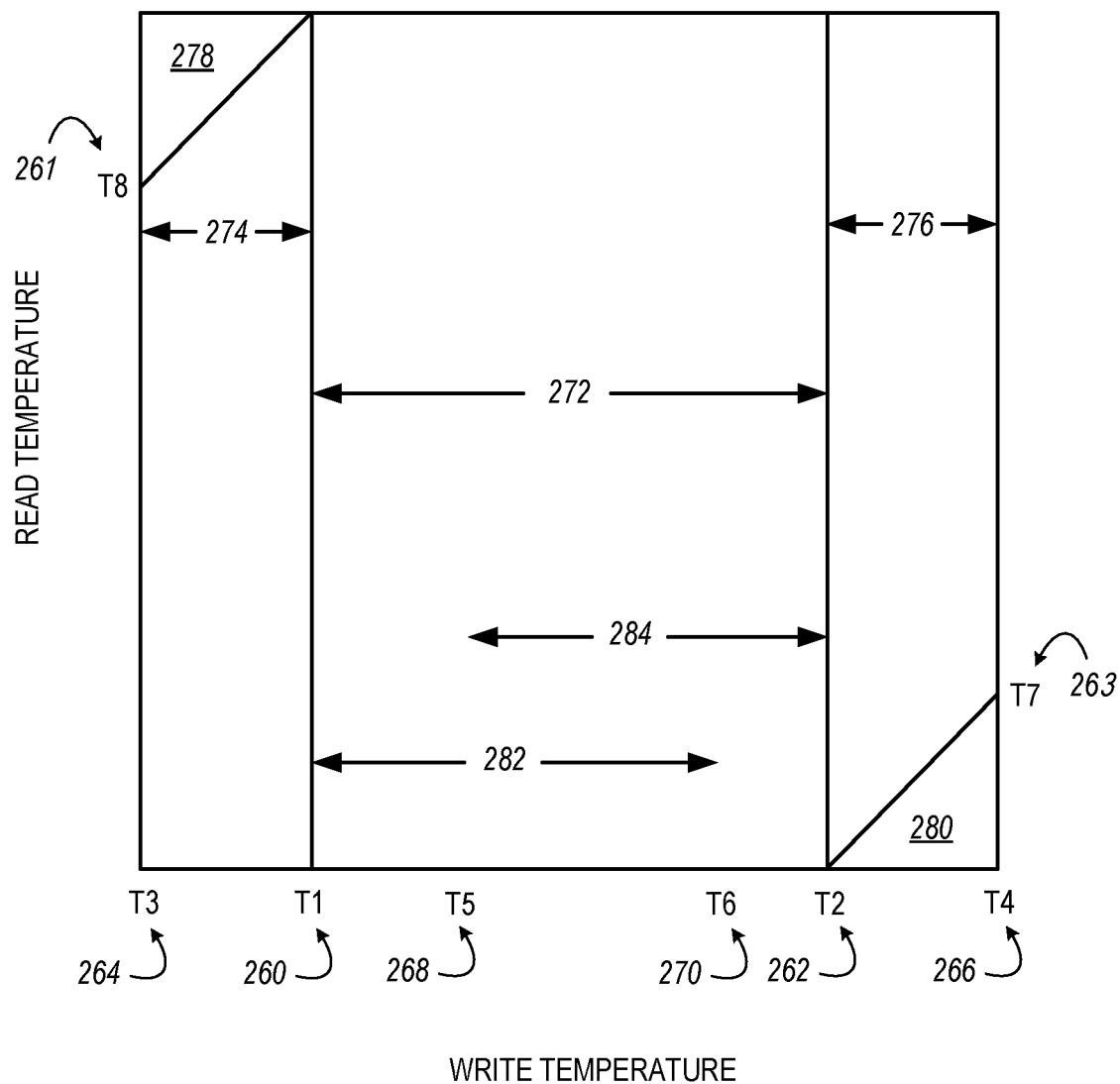
FIG. 2 is a read temperature vs write temperature diagram corresponding to memory sub-system temperature control in accordance with some embodiments of the present disclosure.

FIG. 2 is a read temperature vs write temperature diagram corresponding to memory sub-system temperature control in accordance with some embodiments of the present disclosure. The read temperature and write temperature correspond to temperature values of the memory sub-system 100, e.g., a temperature value of the memory device 130 and/or memory cells associated with the memory device 130, in accordance with some embodiments of the present disclosure. As illustrated in FIG. 2, the write temperature can have a threshold temperature range 272. The threshold temperature range 272 extends from T1 260, which is a relatively lower temperature value, to T2 262, which is a relatively higher temperature value as compared to T1 260.

Embodiments of the present disclosure provide that T1 260 may have various temperature values for different applications, e.g., as previously mentioned. For example, T1 260 may have a temperature value in a range from −55 degrees Celsius (° C.) to 5° C. For example, T1 260 may have a temperature value of −55, −40, −30, −20, −10, or 5° C., among other temperature values in the range from −55° C. to 5° C.

Embodiments of the present disclosure provide that T2 262 may have various temperature values for different applications. For example, T2 262 may have a temperature value in a range from 65° C. to 130° C. For example, T2 262 may have a temperature value of 65, 75, 85, 100, 110, 125 or 130° C., among other temperature values in the range from 65° C. to 130° C.

The threshold temperature range 272 includes the relatively lower temperature value T1 260, the relatively higher temperature T2 262, and each temperature value between T1 260 and T2 262. Embodiments of the present disclosure provide that the threshold temperature range 272 may have various temperature values for different applications. For example, the threshold temperature range 272 may have a lower limit of −55, −40, −30, −20, −10, or 5° C. (corresponding to a temperature value of T1 260) and an upper limit of 65, 75, 85, 100, 110, 125 or 130° C. (corresponding to a temperature value of T2 262).

As illustrated in FIG. 2, temperature values 274 that are less than temperature value T1 260 exceed, e.g., go beyond, the threshold temperature range 272. Temperature values 274 that are less than temperature value T1 260 may extend to a temperature value T3 264. T3 264 may have various temperature values for different applications. However, embodiments provide that the temperature value T3 264 is less than the temperature value T1 260.

Data that is written to the memory component, e.g., the memory device 130 of the memory sub-system 110 at temperature values 274, which are less than temperature value T1 260, can be assigned an indication, e.g., the data can be marked. Assigning the indication provides that when the memory component is at a temperature that is greater than the temperature values 274 the data is rewritten to the memory component.

FIG. 2 illustrates region 278. One or more embodiments provide that region 278 indicates a read failure region where data will not be at a read temperature T8 261 or greater. For instance, for a number of applications, read temperature values within region 278 are too different, e.g., distant, from a corresponding write temperature to be read. A portion of region 278 corresponds to a read temperature value T8 261. Read temperature T8 261 has a temperature value that is greater than read temperature T7 263, which has a temperature value closer to temperature value T1 260 than does read temperature T8 261. One or more embodiments of the present disclosure provide that temperature value T8 261 corresponds to, i.e. has the same write temperature value as, temperature value T6 270.

One or more embodiments provide that data that is written to the memory component at a temperature value 274 is rewritten to the memory component at a temperature value within a low temperature subset 282 of the threshold temperature range 272. The low temperature subset 282 includes the relatively lower temperature value T1 260, the relatively higher temperature value T6 270, and each temperature value between T1 260 and T6 270. The low temperature subset 282 does not include temperature values that are greater than temperature value T6 270 that are within the threshold temperature range 272. One or more embodiments help ensure that data that is written to the memory component at a temperature value 274 can be subsequently read after that data is rewritten to the memory component at a temperature value within the low temperature subset 282.

Temperature value T6 270 may have various temperature values for different applications. However, embodiments provide that the temperature value T6 270 is less than the temperature value T2 262. For example, the temperature value T6 270 may be 5, 10, 15, or 20° C. less than, among other temperature values, the temperature value T3 262.

As illustrated in FIG. 2, temperature values 276 that are greater than temperature value T2 262 exceed, e.g., go beyond, the threshold temperature range 272. Temperature values 276 that are greater than temperature value T2 262 may extend to a temperature value T4 266. T4 266 may have various temperature values for different applications. However, embodiments provide that the temperature value T4 266 is greater than the temperature value T2 262.

Data that is written to the to the memory component of the memory sub-system 110 at temperature values 276, which are greater than the temperature value T2 262, can be assigned an indication, e.g., the data can be marked. Assigning the indication provides that when the memory component is at a temperature that is less than the temperature values 276 the data is rewritten to the memory component.

FIG. 2 illustrates region 280. One or more embodiments provide that region 280 indicates a read failure region where data will not be at a read temperature T7 263. For instance, for a number of applications, read temperature values within region 280 are too different, e.g., distant, from a corresponding write temperature to be read. A portion of region 280 corresponds to a read temperature value T7 263. Read temperature T7 263 has a temperature value that is less than read temperature T8 261. One or more embodiments of the present disclosure provide that temperature value T7 263 corresponds to, i.e. has the same write temperature value as, temperature value T5 268.

One or more embodiments provide that data that is written to the memory component at a temperature value 276 is rewritten to the memory component at a temperature value within a high temperature subset 284 of the threshold temperature range 272. The high temperature subset 284 includes the relatively higher temperature value T2 262, the relatively lower temperature value T5 268, and each temperature value between T2 262 and T5 268. The high temperature subset 284 does not include temperature values that are less than temperature value T5 268 that are within the threshold temperature range 272. One or more embodiments help ensure that data that is written to the memory component at a temperature value 276 can be subsequently read after that data is rewritten to the memory component 130 at a temperature value within the high temperature subset 284.

Temperature value T5 268 may have various temperature values for different applications. However, embodiments provide that the temperature value T5 268 is greater than the temperature value T1 260. For example, the temperature value T5 268 may be 5, 10, 15, or 20° C. greater than, among other temperature values, the temperature value T1 260.

One or more embodiments provide that a portion of the low temperature subset 282 of the threshold temperature range 272 overlaps a portion of a high temperature subset 284 of the threshold temperature range 272. For instance, as illustrated in FIG. 2, relatively lower temperature value T5 268 and relatively higher temperature value T6 270 are respectively in both low temperature subset 282 and high temperature subset 284. As such, a portion of the low temperature subset 282 and a portion of a high temperature subset 284 overlap from the relatively lower temperature value T5 268 and relatively higher temperature value T6 270. However, embodiments are not so limited. While not illustrated, one or more embodiments provide that the low temperature subset of the threshold temperature range and the high temperature subset of the threshold temperature range do not overlap. One or more embodiments provide that each temperature value in the low temperature subset is a distinct and different temperature value than each temperature value in the high temperature subset. In other words, one or more embodiments provide that each temperature value in the low temperature subset is less than the lowest temperature value of the high temperature subset.

Figure 3:
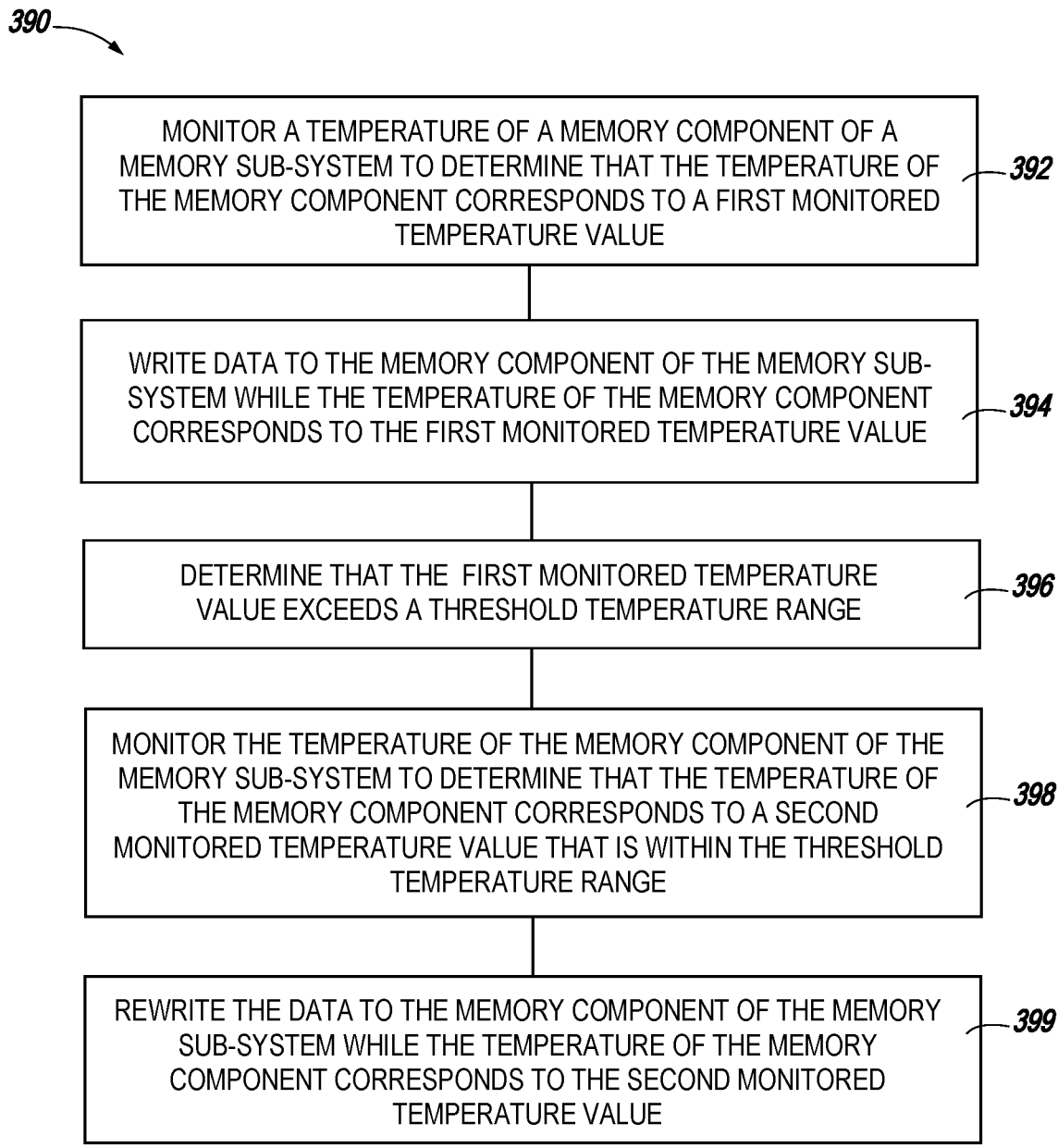
FIG. 3 is a flow diagram corresponding to a method for memory sub-system temperature control in accordance with some embodiments of the present disclosure.

FIG. 3 is flow diagram corresponding to a method 390 for memory sub-system temperature control in accordance with some embodiments of the present disclosure. The method 390 can be performed by processing logic that can include hardware, e.g., processing device, circuitry, dedicated logic, programmable logic, microcode, hardware of a device, integrated circuit, etc., software, e.g., instructions run or executed on a processing device, or a combination thereof. In some embodiments, the method 390 is performed by the memory sub-system temperature control component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 392, a temperature of a memory component of a memory sub-system is monitored to determine that the temperature of the memory component corresponds to a monitored temperature value, e.g., a first monitored temperature value. In some embodiments, the memory sub-system can be analogous to the memory sub-system 110 illustrated in FIG. 1 while the memory component can be analogous to the memory devices 130/140 illustrated in FIG. 1. As previously mentioned, the temperature of a memory component of a memory sub-system can be monitored continuously or incrementally, e.g., to determine the monitored temperature value.

At operation 394, data is written to the memory component of the memory sub-system while the temperature of the memory component corresponds to the monitored temperature value.

At operation 396, it is determined that the monitored temperature value exceeds a threshold temperature range. For instance, the monitored temperature value may be below the threshold temperature range, e.g., the monitored temperature value is less than all of the temperature values of the threshold temperature range, or the monitored temperature value may be above the threshold temperature range, e.g., the monitored temperature value is greater than all of the temperature values of the threshold temperature range.

At operation 398, the temperature of the memory component of the memory sub-system is monitored to determine that the temperature of the memory component corresponds to a different monitored temperature, e.g., a second monitored temperature value that is within the threshold temperature range.

At operation 399, the data is rewritten to the memory component of the memory sub-system while the temperature of the memory component corresponds to the different monitored temperature value.

In some embodiments, the method 390 can include rewriting the data to the memory component of the memory sub-system while the temperature of the memory component is at a subset of the threshold temperature range. For example, the data can be rewritten to the memory component of the memory sub-system while the temperature of the memory component is at a low temperature subset of the threshold temperature range. Alternatively, the data can rewritten be to the memory component of the memory sub-system while the temperature of the memory component is at a high temperature subset of the threshold temperature range.

In some embodiments, the method 390 can include that the threshold temperature range is from −40° C. to 125° C. As previously mentioned, embodiments of the present disclosure provide that the threshold temperature range may have various temperature values for different applications.

In some embodiments, the method 390 can include reading the rewritten data from the memory component at a third monitored temperature value that is different than the first monitored temperature and the second monitored temperature.

In some embodiments, the method 390 provides that the non-volatile memory component is a replacement gate three-dimensional NAND memory component.

Figure 4:
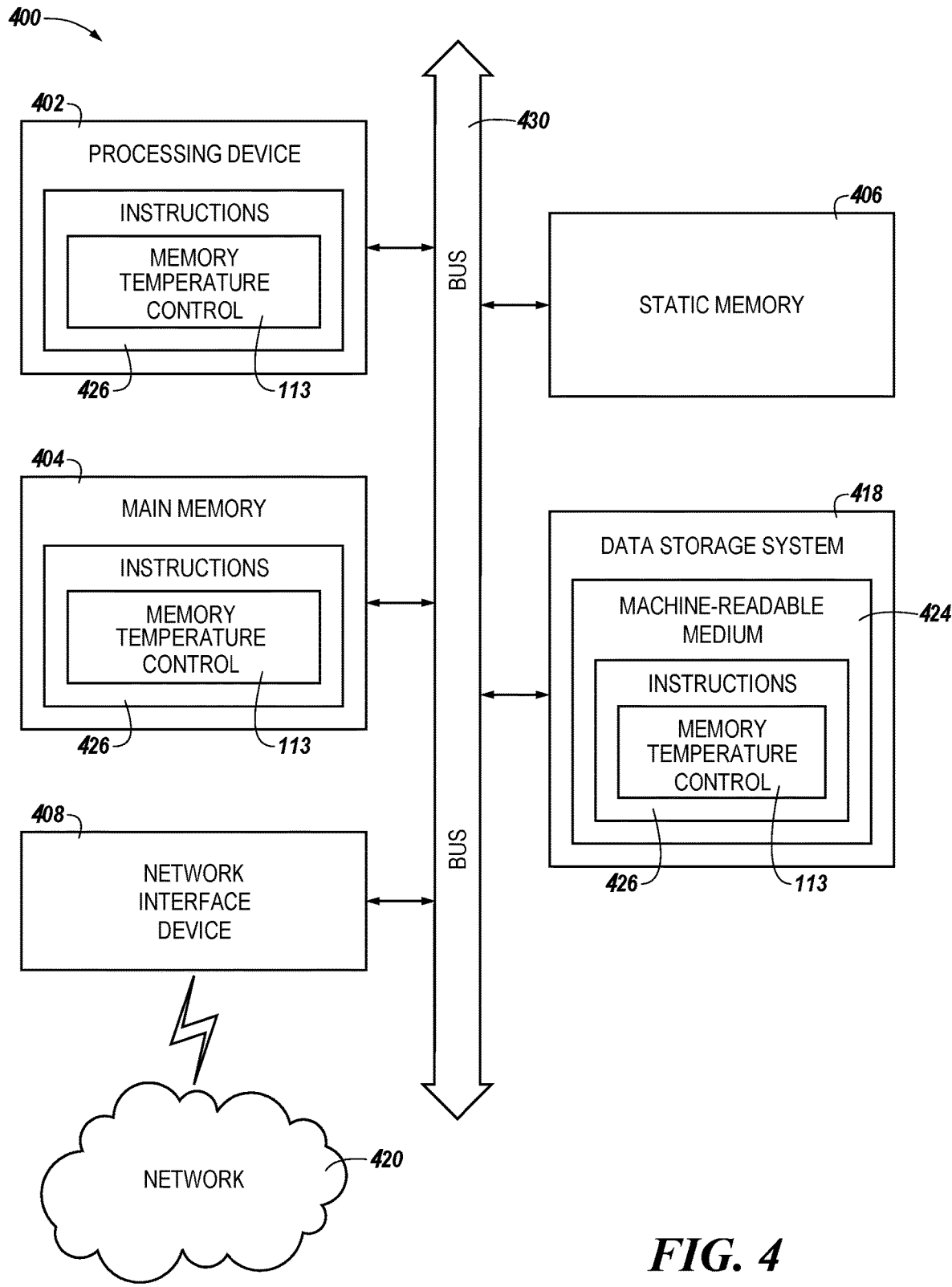
FIG. 4 is a block diagram of an example computer system in which embodiments of the present disclosure may operate.

FIG. 4 is a block diagram of an example computer system 400 in which embodiments of the present disclosure may operate. For example, FIG. 4 illustrates an example machine of a computer system 400 within which a set of instructions, for causing the machine to perform any one or more of the methodologies discussed herein, can be executed. In some embodiments, the computer system 400 can correspond to a host system, e.g., the host system 120 of FIG. 1, that includes, is coupled to, or utilizes a memory sub-system, e.g., the memory sub-system 110 of FIG. 1, or can be used to perform the operations of a controller, e.g., to execute an operating system to perform operations corresponding to the temperature control component 113 of FIG. 1. In alternative embodiments, the machine can be connected, e.g., networked, to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404, e.g., read-only memory (ROM, flash memory, dynamic random access memory (DRAM) such as synchronous DRAM (SDRAM) or Rambus DRAM (RDRAM), etc.), a static memory 406, e.g., flash memory, static random access memory (SRAM), etc., and a data storage system 418, which communicate with each other via a bus 430.

The processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a temperature control component, e.g., the temperature control component 113 of FIG. 1. While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine, e.g., a computer. In some embodiments, a machine-readable, e.g., computer-readable, medium includes a machine, e.g., a computer, readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   monitoring a temperature of a memory component of a memory sub-system to determine that the temperature of the memory component corresponds to a first monitored temperature value;
   writing data to the memory component of the memory sub-system while the temperature of the memory component corresponds to the first monitored temperature value;
   determining that the first monitored temperature value exceeds a threshold temperature range that extends from a lower temperature value to a relatively higher temperature value;
   assigning an indication to the data written to the memory component of the memory sub-system at the first monitored temperature as data written above the threshold temperature range when the first monitored temperature is above the threshold temperature range;
   monitoring the temperature of the memory component of the memory sub-system to determine that the temperature of the memory component corresponds to a second monitored temperature value that is within the threshold temperature range; and
   rewriting the data to the memory component of the memory sub-system while the temperature of the memory component corresponds to the second monitored temperature value, wherein when the first monitored temperature is below the threshold temperature range the data is rewritten to the memory component of the memory sub-system while the temperature of the memory component is at a low temperature subset of the threshold temperature range and when the first monitored temperature is above the threshold temperature range the data is rewritten to the memory component of the memory sub-system while the temperature of the memory component is at a high temperature subset of the threshold temperature range, wherein the low temperature subset includes the lower temperature value and does not include the relatively higher temperature value and the high temperature subset includes the relatively higher temperature value and does not include the lower temperature value, wherein the lower temperature value is about −55° C. and the low temperature subset increasingly extends above the lower temperature value.

2. The method of claim 1, wherein a portion of the low temperature subset of the threshold temperature range overlaps a portion of a high temperature subset of the threshold temperature range.

3. The method of claim 1, wherein a portion of the high temperature subset of the threshold temperature range overlaps a portion of a low temperature subset of the threshold temperature range.

4. The method of claim 1, further comprising reading the rewritten data from the memory component at a third monitored temperature value that is different than the first monitored temperature and the second monitored temperature.

5. The method of claim 1, wherein the non-volatile memory component is a replacement gate three-dimensional NAND memory component.

6. An apparatus, comprising:
a memory sub-system temperature control component configured to:
determine a first monitored temperature of a memory component of the memory sub-system, wherein data is written to the memory component of the memory sub-system at the first monitored temperature;
determine that the first monitored temperature exceeds a threshold temperature range that extends from a lower temperature value to a relatively higher temperature value;
assign an indication to the data written to the memory component of the memory sub-system at the first monitored temperature as data written above the threshold temperature range when the first monitored temperature is above the threshold temperature range;
determine a second monitored temperature of the memory component of the memory sub-system within the threshold temperature range; and
rewrite the data to the memory component of the memory sub-system at the second monitored temperature, wherein when the first monitored temperature is below the threshold temperature range the data is rewritten to the memory component of the memory sub- system while the temperature of the memory component is at a low temperature subset of the threshold temperature range and when the first monitored temperature is above the threshold temperature range the data is rewritten to the memory component of the memory sub-system while the temperature of the memory component is at a high temperature subset of the threshold temperature range, wherein the low temperature subset includes the lower temperature value and does not include the relatively higher temperature value and the high temperature subset includes the relatively higher temperature value and does not include the lower temperature value, wherein the lower temperature value is about −55° C. and the low temperature subset increasingly extends above the lower temperature value.

7. The apparatus of claim 6, wherein the temperature control component is further configured to assign an indication to the data written to the memory component of the memory sub-system at the first monitored temperature indicating that the data was written below the threshold temperature range.

8. The apparatus of claim 7, wherein the temperature control component is further configured to assign an indication to the rewritten data to the memory component of the memory sub-system at the second monitored temperature as written within the threshold temperature range.

9. The apparatus of claim 6, wherein the temperature control component is further configured to assign an indication to the rewritten data to the memory component of the memory sub-system at the second monitored temperature as written within the threshold temperature range.

10. A system, comprising:
a plurality of memory components arranged to form a stackable cross-gridded array of memory cells; and
a processing device coupled to the plurality of memory components, the processing device to perform operations comprising:
monitoring a first temperature value of a memory component of a memory sub- system;
writing data to the memory component of the memory sub-system at the first monitored temperature value;
determining the first monitored temperature value exceeds a threshold temperature range that extends from a lower temperature value to a relatively higher temperature value;
assigning an indication to the data written to the memory component of the memory sub-system at the first monitored temperature value as data written above the threshold temperature range when the first monitored temperature is above the threshold temperature range;
monitoring a second temperature value of the memory component of the memory sub-system within the threshold temperature range;
rewriting the data to the memory component of the memory sub-system at the second monitored temperature value, wherein when the first monitored temperature is below the threshold temperature range the data is rewritten to the memory component of the memory sub-system while the temperature of the memory component is at a low temperature subset of the threshold temperature range and when the first monitored temperature is above the threshold temperature range the data is rewritten to the memory component of the memory sub-system while the temperature of the memory component is at a high temperature subset of the threshold temperature range, wherein the low temperature subset includes the lower temperature value and does not include the relatively higher temperature value and the high temperature subset includes the relatively higher temperature value and does not include the lower temperature value, wherein the lower temperature value is about −55° C. and the low temperature subset increasingly extends above the lower temperature value; and
assign an indication to the data rewritten to the memory component of the memory sub-system at the second monitored temperature value as data written within the threshold temperature range.

11. The system of claim 10, wherein the processing device is to perform operations comprising continuously monitoring the temperature of the memory component of a memory sub-system.

12. The system of claim 10, wherein portion of the low temperature subset of the threshold temperature range overlaps a portion of a high temperature subset of the threshold temperature range.

13. The system of claim 10, wherein portion of the high temperature subset of the threshold temperature range overlaps a portion of a low temperature subset of the threshold temperature range.

14. The system of claim 11, wherein the processing device is to perform operations comprising reading data rewritten to the memory component of the memory sub-system at the second monitored temperature value, wherein reading the rewritten data occurs a third monitored temperature value that is different than the first monitored temperature value and the second monitored temperature value.

* * * * *